United States Patent [19]
Heath et al.

[11] 3,996,560
[45] Dec. 7, 1976

[54] SEQUENCING UNIT

[75] Inventors: Frederick G. Heath, Edinburgh, Scotland; Charles W. Rose; Edward L. Glaser, both of Cleveland Heights, Ohio

[73] Assignee: Case Western Reserve University, Cleveland, Ohio

[22] Filed: May 16, 1974

[21] Appl. No.: 578,306

[52] U.S. Cl. .......................... 340/147 P; 307/203; 307/218; 328/75

[51] Int. Cl.² .................. H04Q 9/00; H03K 19/08; G06F 3/00

[58] Field of Search ....... 340/147 P, 213 Q, 166 R; 328/74, 75, 92, 94, 97; 307/203, 213, 216–218; 235/150, 151, 150.5, 152

[56] References Cited
UNITED STATES PATENTS

| | | | |
|---|---|---|---|
| 3,168,700 | 2/1965 | Gesek et al. | 328/75 X |
| 3,189,755 | 6/1965 | Kintner | 328/74 X |
| 3,285,044 | 11/1966 | Gregson et al. | 307/203 X |
| 3,320,539 | 5/1967 | Rodner | 328/92 X |
| 3,482,111 | 12/1969 | Gunderson et al. | 307/203 |
| 3,484,700 | 12/1969 | Armstrong | 307/218 X |
| 3,599,184 | 8/1971 | Beinart et al. | 307/203 X |
| 3,600,687 | 8/1971 | Dusheck, Jr. | 307/203 X |
| 3,634,769 | 1/1972 | Sleater | 328/75 |
| 3,805,168 | 4/1974 | Marchand et al. | 307/218 X |
| 3,808,544 | 4/1974 | Walker | 328/75 |
| 3,810,160 | 5/1974 | Hedde | 340/166 R |
| 3,816,725 | 6/1974 | Greer | 340/166 R |
| 3,849,638 | 11/1974 | Greer | 235/152 |
| 3,855,536 | 12/1974 | Neuner | 328/92 |

*Primary Examiner*—Donald J. Yusko
*Attorney, Agent, or Firm*—John R. Utermohle; Thomas O. Maser; Barry N. Young

[57] ABSTRACT

An automatic sequencing circuit is disclosed which recognizes a particular coded input signal, initiates a process or data operation, and provides a coded output indicative of the operation performed. The circuit is particularly suited to hardware implementation of the control graph of a directed-graph design for any equipment using digital logic circuits.

10 Claims, 13 Drawing Figures

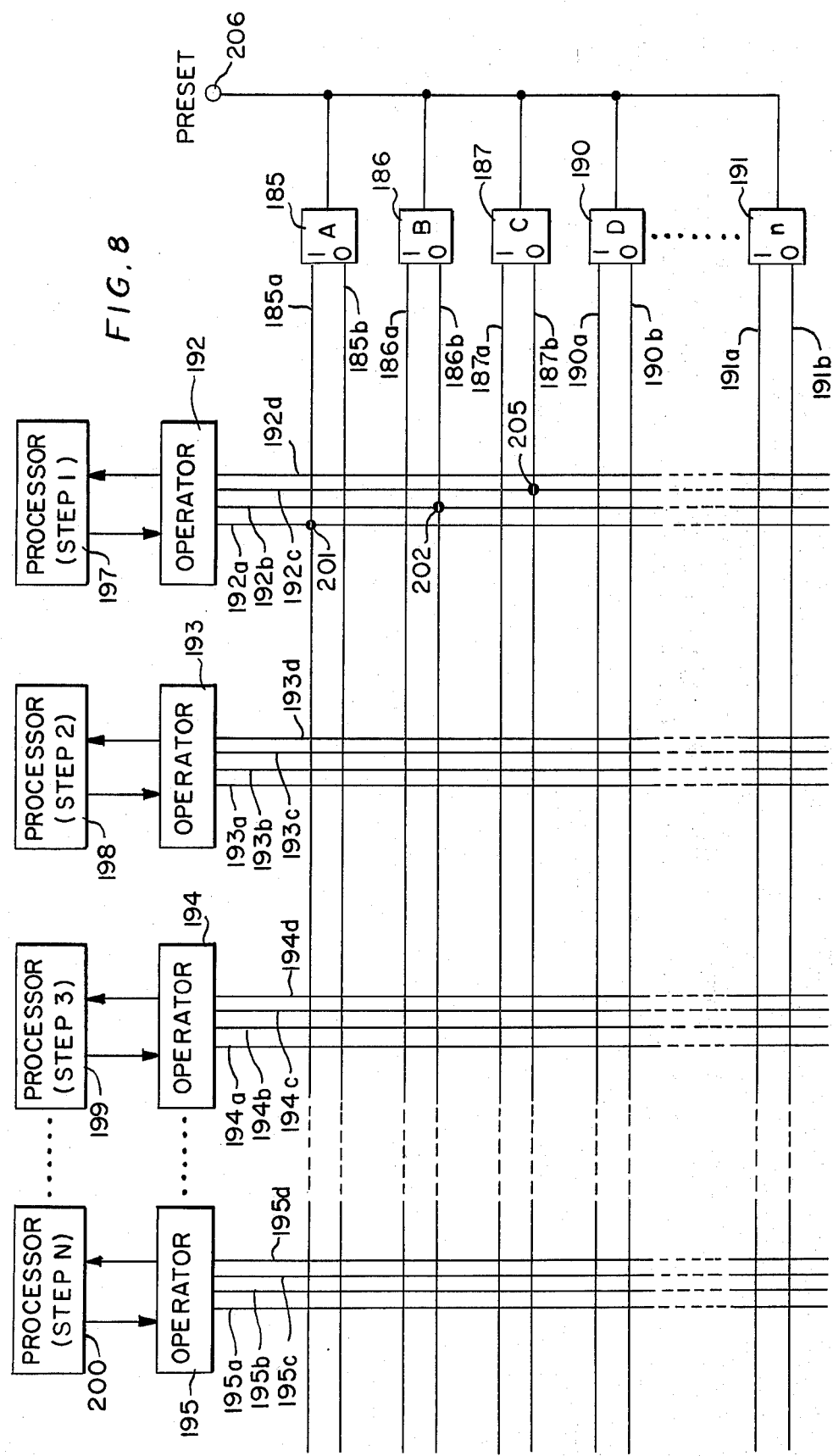

SEQUENCING UNIT

BACKGROUND OF THE INVENTION

1. Field of the Invention

This invention relates generally to the field of digital systems design, and more specifically to the design of such systems wherein a small library of modules, with a regular structure amenable to printed circuit board or integrated circuit packaging, are used to directly translate a directed-graph designed system into a hardware configuration.

2. Description of the Prior Art

For many years the design of large digital systems has followed largely intuitive approach in which the boundaries between hardware and software are usually defined before most of the system itself has been designed. Until recently, the hardware was designed with the primary object of employing the minimum number of components rather than with a view to attaining complete reliability, and, where exhaustive simulation was not possible, problems would often appear after the hardware had been released. Software is usually designed by a team rather than by a single person, a process which often causes interfacing problems. The release of major software elements of a system is frequently followed by a series of corrections which may continue for several years.

For the past several years, researchers have been experimenting with various techniques for the generalized design of digital systems. One approach has been to define systems by directed graphs. These graphs have certain properties which allow the stepwise analysis of entire systems for logical and structural consistency without the necessity for exhaustive simulation. A further advantage of using directed graphs in the design process is that they allow decisions on the hardware/software boundary to be postponed until the designer has sufficient information to make an intelligent choice. More detailed information on this type of representation may be found in Bradshaw, F. T., "Structure and Representation of Digital Computer Systems," Doctorial Thesis, Case Western Reserve University, Cleveland, Ohio, January, 1971; and Rose, C. W., "A System of Representation for General Purpose Digital Computer Systems," Doctorial Thesis, Case Western Reserve University, Cleveland, Ohio, September, 1970.

Once a system is designed using such concepts, it becomes necessary to synthesize hardware realizations from these directed graphs. It is desirable to have a small library of standard modules having a regular structure amenable to standard printed circuit boards or integrated circuit packaging, with which one can directly build the needed hardware from the graphical representation using building-block techniques. It is to this end that the present invention is directed.

BRIEF SUMMARY OF THE INVENTION

Accordingly, it is an object of this invention to provide a sequencing unit by means of which a digital systems designer can directly translate a directed graph design into a hardware embodiments.

It is also an object to provide a means which regular structure and building-block approach to hardware engineering.

It is a further object to provide a tool to aid in the reduction of design errors in hardware engineering products.

It is a further object to provide a device useful in linking software and hardware for engineering development.

It is a still further object to provide a tool useful in reducing research and development time for hardware engineering products.

It is still further object to provide a device useful in reducing interfacing errors in hardware engineering products.

It is still a further object to provide a device useful in reducing errors in interfacing hardware engineering products to software engineering products.

It is yet another object to provide a tool which will significantly reduce errors in converting from the design to the hardware embodiment.

It is an object of this invention to provide a tool aiding in the development of "certifiable" digital systems.

It is a still further object to provide a means for building easily modifiable hardware/software-type devices.

An apparatus for the automatic sequencing of a process, having all the advantages described above, might include a processor capable of performing a process step upon activation, and of providing a signal upon completion of the step; a plurality of control cells means for inserting a predetermined electrical signal representation of a binary value into each control cell; an operator connecting the processor and selected ones of said control cells, the operator activating the processor upon receipt of a predetermined group of binary values from the selected control cells, and means for complementing the values in selected one of said selected control cells upon receipt of the completion signal from the processor.

A complete understanding of the invention, and the manner of process of making and using it, is set forth herein below by way of a detailed description of the best mode contemplated by the inventors of carrying out their invention.

BRIEF DESCRIPTION OF DRAWINGS

The specification may be better understood when read in conjunction with the drawings, wherein:

FIG. 4b is a vector representation of the operations of the process of FIG. 4a;

FIG. 8 is a block diagram indicating the connective relationship of the various elements of the invention.

DESCRIPTION OF THE PREFERRED EMBODIMENT

The invention described herein uses a small library of modules having a regular structure to allow the efficient translation from directed graphs to circuit hardware. The theory and usefulness of the directed graph representational system is described in detail in the above-cited references by Bradshaw and Rose. While the applicability of this invention is not limited thereto, it is believed that the invention will find its major usefulness in the design and construction of large and complex computer systems. The invention has equal applicabiltiy to digital systems used for computational purposes and for digital systems used to control manufacturing or similar processes.

For a complete understanding of this invention, a brief discussion of directed graphs may be useful. Basically, directed graphs are flow diagrams of a system from which it is possible to logically analyze a system in order to ascertain its operability. The directed graph utilization represented herein consists of a system containing two structures; a data graph and a control graph. The data graph represents the actual processes while the control graph represents the flow of "enables" to corresponding elements of the data graph. Since this invention relates specifically to the control graph, only that part will be discussed here.

The control graph consists of two main elements; control cells and operators. The control cells are state variables which are used to control the current state of the system, while operators are used to first trigger their corresponding process steps in the data graph when the system is in the appropriate state and to then change the state of this system upon the completion of the process step.

Figure 1A:
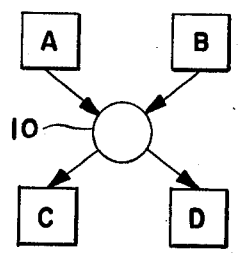
FIG. 1a is a flow chart representation of an "AND" operator.
Figure 1B:
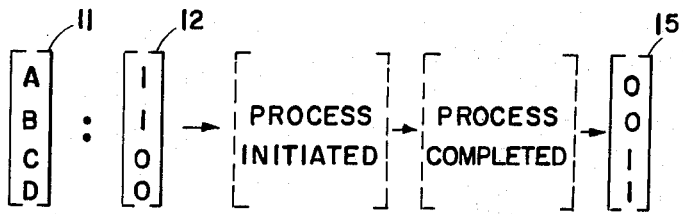
FIG. 1b is a vector representation of the operation of an "AND" operator.
Figure 2A:
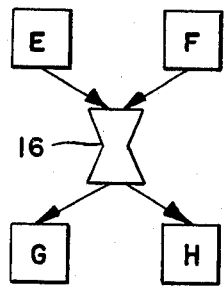
FIG. 2a is a flow chart representation of an "OR" operator.

Referring to FIGS. 1, 2, and 3, the operators used in control graphs are identified. In FIG. 1a, the operator 10 is an "AND" operator. It reads the values in the control cells A and B, and provides values to the control cells C and D according to the rule given in FIG. 1b. When the vector 11, represented by (A, B, C, D) has the value (1, 1, 0, 0), indicated as the vector 12, the appropriate process step as shown in a corresponding data graph will be initiated. Upon the completion of that process step, the input vector 12 will be transformed into the vector 15 having the value (0, 0, 1, 1). As may be seen from this example, the "AND" operator 10 performs a logical "AND" on the values of all the control cells leading into and out of that operator. Specifically, it "AND's " the logic "1's" contained in the input control cells and the logic "0's" containing in the output control cells to initiate the appropriate process step. Upon the process completion signal, each component of the input vector is complemented. The "AND" operator may contain any number of inputs and outputs.

Figure 2B:
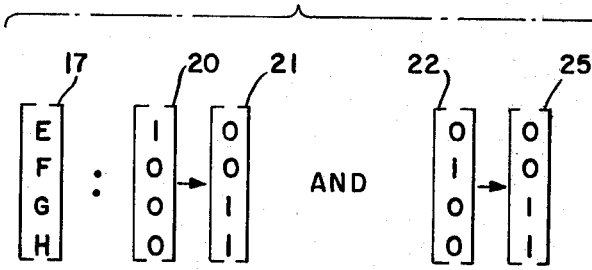
FIG. 2b is a vector representation of the operation of an "OR" operator.

Referring to FIG. 2, the "OR" operator 16 is defined. The "OR" operator 16 receives as inputs the values contained in the control cells E and F, and provides values to the control cells G and H according to the rule of FIG. 2b. Specifically, if the vector 17 (E, F, G, H) contains the value (1, 0, 0, 0) as shown by vector 20, the corresponding process in the data graph will be initiated. Upon the process completion signals, the vector will be transformed to the vector 21 (0, 0, 1, 1). If the vector initially contains the value (0, 1, 0, 0), indicated by vector 22, it will be transformed into the vector 25 (0, 0, 1, 1) following process completion. With a few simple design changes it is possible to construct an "OR" operator such that if the input vector 17 initially contains the value (1, 1, 0, 0), the process step will be initiated twice, cancelling each of the two input "1's" separately.

Figure 3A:
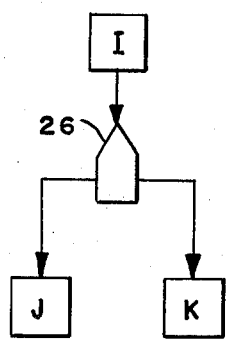
FIG. 3a is a flow chart representation of a "PREDICATE" operator.
Figure 3B:
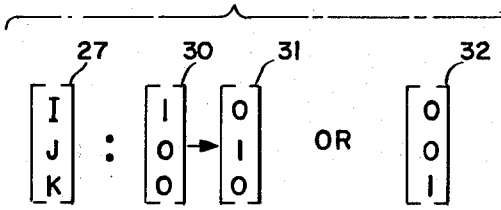
FIG. 3b is a vector representation of the operation of a "PREDICATE" operator.

The "PREDICATE" operator 26 in FIG. 3a operates on the values contained in the control cells I, J and K according to the rule of FIG. 3b. If the vector 27 (I, J, K) contains the value (1, 0, 0) illustrated by vector 30, the appropriate process in the data graph is initiated. Upon process completion, the vector will be transformed to the vector 31 (0, 1, 0) or the vector 32 (0, 0, 1), the particular transformation being dependent upon the data graph process. This allows for a decision making capability within the control graph.

Figure 4A:
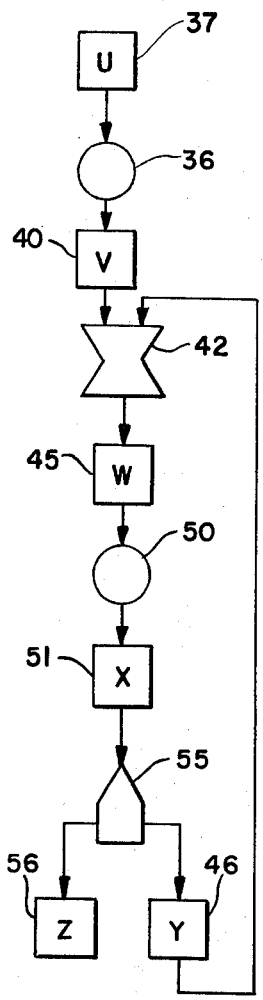
FIG. 4a is a flow chart representation of an example multi-step process.
Figure 4B:
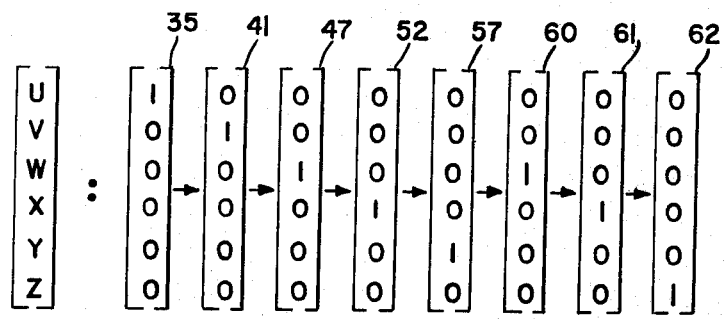

FIG. 4 illustrates a sample multi-step process. Note that each operator is both preceeded and followed by a control cell. In FIG 4b there is illustrated the sequence of vectors indicating the various states of the control cells as the process progresses. The process begins upon the external presetting of the control cells as shown in the vector 35. The operator 36 performs a logical "AND" on the "1" in control cell U 37 and the "0" in control cell V 40 to initiate a first step of the process. Upon the completion of the first step, the "1" in control cell U 37 is transformed to a "0", and the "0" in control cell V 40 is transformed to a "1", yielding the vector 41. The "OR" operator 42 is initiated upon combination of a "0" in control cell W 45 and a "1" in either of the control cells V 40 or Y 46. The proper combination of states shown by vector 41 initiates the second step of the process. Upon process completion, the "1" in control cell V 40 is transformed to a "0" and the "0" in control cell W 45 is transformed to a "1", producing the vector 47. This condition automatically initiates the third process step via the operator 50. Process completion transforms the "1" in control cell W445 to a "0" and the "0" in control cell X 51 to a "1", yielding the vector 52. The vector 52 automatically initiates the fifth step of the process through the "PREDICATE" operator 55. It may be recalled from FIG. 3b that the initiating vector of a "PREDICATE" operator can result in one of two completion vectors depending upon the data process. Let us suppose, for purposes of this example, that the first time in the process that this step is reached the control operator Y 46 is transformed to a "1" and the process continues. We also suppose that the second time this point is reached, the control cell Z 56 is transformed, indicating the end of the process. Therefore, the first time through the process the vector 52 initiates step 4 of the process, with the completion of this step transforming the "1" in control cell X 51 to "0" and the "0" in control cell Y 46 to a "1" producing the vector 57. The "1" in control cell Y 46 and the "0" in control cell W 45 provides the proper vector for the "OR" operator 42 to again be activated, initiating step 5 of the process. As before, completion of this process transforms the "0" in control cell W 45 to a "1", and additionally transforms the "1" in control cell Y 46 to a "0", producing the vector 60. Note that this vector is identical to vector 47, causing an initiation of step 6, and producing the vector 61 upon completion of that step. The step 7, controlled by operator 55, is now activated. Because this is the second initiation of a process step by operator 55, the completion signal will include information causing the transformation of control cell Z 56 rather than Y 46. Accordingly, the "1" in control cell X 51 is transformed into a "0" and the "0" in control cell Z 56 is transformed to a "1", as in vector 62. Since no operator is activated by the vector 62, the process is completed at this point and requires an external restart for further processing. It would be obvious from the above description that any given process step will be initiated by a unique combination of values in those control cells associated with that step. Similarly, no more than one process step will be initiated by any given combination of values in the control cells.

While the above theory of system representation has been studied for some time, there has not been, up to now, a systematic means for translating that representation into hardware. Our invention provides such a means of translation.

Control cells suitable for implementation in this invention may comprise a common bistable flip-flop made with open collector gates. With this configuration, an output given a pulse to ground will cause the other output to become high, which will cause the pulsed output to remain at ground.

Figure 5:
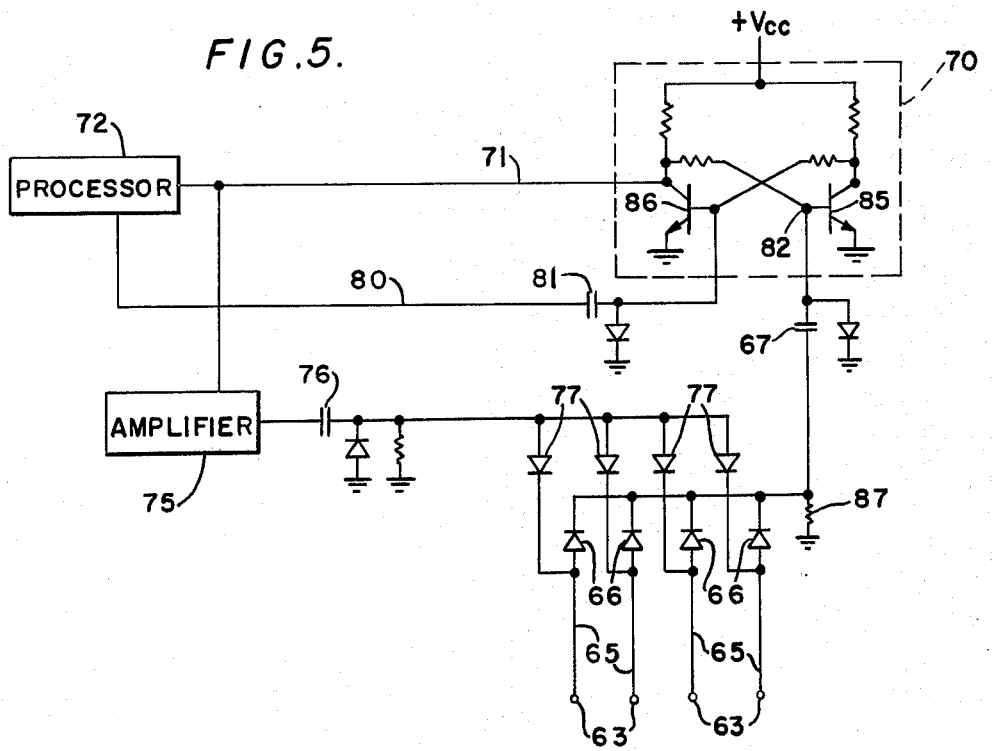
FIG. 5 is a simplified schematic diagram of an "AND" operator.

FIG. 5 illustrates one manner in which an "AND" operator may be configured. A plurality of lines 65-65 are connected at terminals 63-63 from the appropriate control cells through a plurality of diodes 66-66 and a capacitor 67 to a set/reset flip-flop 70. An output line 71 from the flip-flop is connected to the "initiate" input of a processor 72 and through an amplifier 75, a capacitor 76 and diodes 77-77 back to the lines 65-65 and the terminals 63-63 connecting the operator to the control cells. A second line 80 connects an output of the processor 72 through a capacitor 81 to a second input of flip-flop 70. Prior to process initiation, at least one of the lines 65-65 will be held at a positive voltage to prevent triggering of flip-flop 70. This positive voltage holds node 82 positive, thereby holding transistor 85 on and transistor 86 off. When the process initiation condition exists, all of the lines 65-65 will be held to ground, allowing capacitor 67 to discharge through a resistor 87 thereby turning off transistor 85. This results in transistor 6 being turned on and the line 71 falling to ground voltage. The processor 72 is activated by this signal to perform a process step. Following completion of the step, processor provides a signal which locks the line 80 to ground, thereby turning off transistor 86 through capacitor 81. This automatically turns transistor 85 back on, and the line 71 again goes positive. This negative-to-positve transition on line 71 is amplified by the amplifier 75 and is passed through the capacitor 76 and the diodes 77-77 to the control cells by the lines 65-65. As described previously, this positive voltage on lines 65-65 resets the control cells to the complement of their initiation state values. While this preferred embodiment describes a means by which the control cells may be complemented by the same control lines which are used as inputs to the operator, it is obvious that the same, results could be achieved with a separate set of control lines to effect the complementation. In summary, the proper setting in the control cells sets flip-flop 70, thereby initiating the processor 72. A completion signal from the processor 72 resets the flip-flop 70 which results in the control cells being reset to the complement of their initiation state values.

Figure 6:
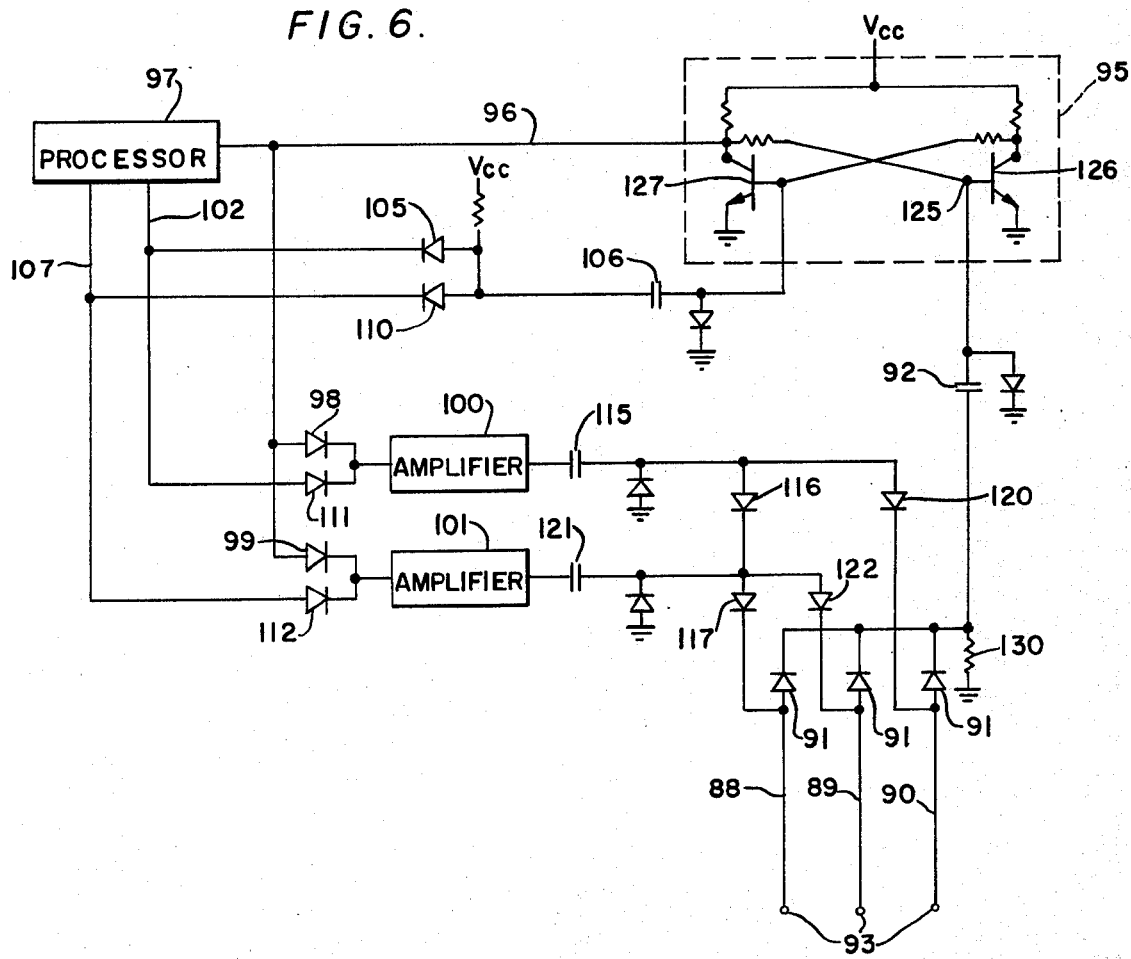
FIG. 6 is a simplified schematic diagram of a "PREDICATE" operator.

FIG. 6 illustrates one manner in which a "PREDICATE" operator may be configured. The lines 88, 89 and 90 are connected from the control cells via terminals 93-93 through the diodes 91-91 and a capacitor 92 to a flip-flop 95. A line 96 connects the flip-flop 95 both to a processor 97 and to amplifier 100 through a diode 98 and to amplifier 101 through diode 99. The processor 97 has two outputs; lines 102 connects a first output through a diode 105 and capacitor 106 to the flip-flop 95, and the second output is connected by line 107 through a diode 110 and the capacitor 106 to the flip-flop 95. In addition, line 102 is connected through a diode 111 to the amplifier 100 and the output line 107 is connected through a diode 112 to the amplifier 101. The output of amplifier 100 is connected through a capacitor 115 and diodes 116 and 117 to line 89, and additionally through diode 120 to line 90. The amplifier 101 is connected through a capacitor 121 to line 88 through the diode 117 and to line 89 through a diode 122. The "PREDICATE" operator remains in its stable state so long as any one of the input lines 88, 89 or 90 carries a positive voltage. In that condition, the node 125 is at a positive potential resulting in transistor 126 being turned on and transistor 127 being turned off. The positive voltage on line 96 holds the processor 97 in its quiescent state. Upon all of the lines 88, 89 and 90 being reduced to ground potenial, the capacitor 92 discharges through a resistor 130 causing transistor 126 to turn off. As a result, transistor 127 is turned on and line 96 then falls to ground potential. This initiates the processor 97. As was described previously, the "PREDICATE" operator provides an output based upon a decision-making process within the processor. Therefore, at the completion of the process step one of the lines 102 or 107 will carry a positive voltage, and the other will carry a ground potential. If line 102 is forced to ground potential, the capacitor 106 will discharge through the diode 105 and the voltage on the base of transistor 127 will fall to ground potential turning transistor 127 off. Similarly, if line 107 is foreced to ground potential, capacitor 106 will discharge through diode 110 and, again, transistor 127 will turn off. This turns transistor 126 on and causes line 96 to jump to a positive potential. This signal on line 96 is amplified by either amplifier 100 or 101 depending upon the signal on line 102 or 107. Specifically, if line 102 is locked to ground, the positive potential on line 96 will not be seen on the imput to amplifier 100, but the combination of positve potentials on both lines 107 and 96 will be amplified by amplifier 101. The resulting positive output will be passed through capacitor 121 and diodes 117 and 122 to lines 88 and 89, thereby complementing the contents of the control cells connected to those lines. If, however, line 107 is locked to ground, the positive potential on line 96 will not be seen at the input to the amplifier 101. In that case, the combination of positive potentials on line 96 and 102 will be passed through the amplifier 100, the capacitor 115, and diodes 116 and 117 to lines 88, as well as through diodes 120 to line 90. As a result, the positive voltages on lines 88 and 90 will complement the contents of the control cells connected thereto. In summary, the correct pattern of values in the control cells trigger the flip-flop 95, thereby initiating the processor 97. Completion of the process step both returns the flip-flop 95 to its original state and complements the values in certain of the control cells according to a rule determined within the processor 97.

Figure 7:
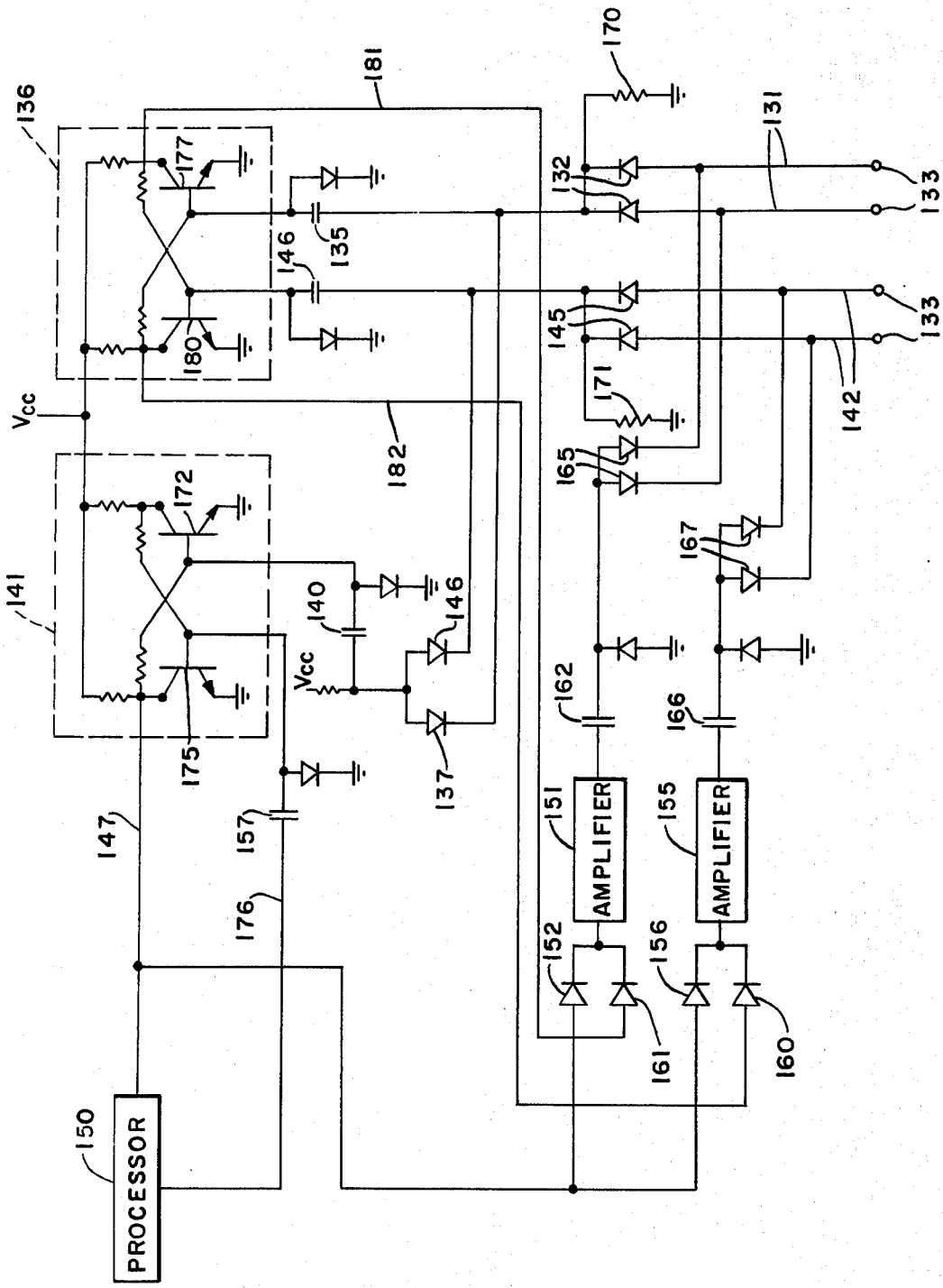
FIG. 7 is a simplified schematic diagram of an "OR" operator.

FIG. 7 illustrates one manner in which an "OR" operator may be configured. Lines 131-131 connect certain control cells (not shown) via terminals 133-133 through diodes 132-132 and a capacitor 135 to a flip-flop 136. The same lines 131-131 are connected through the diodes 132-132, a diode 137 and a capacitor 140 to a second flip-flop 141. Lines 142-142 connect the control cells (not shown) to flip-flop 136 through diodes 145-145 and capacitor 146 and to flip-flop 141 through diodes 145, 145, diode 146, and capacitor 140. A line 147 couples flip-flop 141 to a processor 150, to an amplifier 151 through a diode 152, and to an amplifier 155 through a diode 156. The processor 150 is also coupled to flip-flop 141 through a capacitor 157. One output of the flip-flop 136 is coupled to the amplifier 155 through a diode 160, and another output is connected to amplifier 151 through a diode 161. A signal path couples amplifier 151 to the control cells through a capacitor 162, diodes 165-165 and lines 131-131. The control cells are connected to amplifier 155 through a capacitor 166, diodes 167-167 and lines 142-142.

Prior to process initiation at least one of the wires 142-142 will carry a positive voltage. The process can be initiated by either of the two sets of lines 131-131 or 142-142 all falling to ground potential simultaneously. If, for example, all of the lines 132-132 fall to ground potential, the capacitor 140 will discharge through the diode 137 and the resistor 170. A simultaneous drop to ground potential by all of the lines 142-142 will discharge capacitor 140 through diode 146 and resistor 171. In either case the discharging capacitor 140 will turn transistor 172 off and transistor 175 on. The resulting drop in voltage on line 147 will activate the processor 150. Upon process completion, the processor 150 will drop the voltage on line 176 to zero, and the resulting discharge of capacitor 157 will turn transistor 175 off and transistor 172 on. This returns the line 147 to a positive potential and, as with the previously described operators, complements the control cells.

The manner in which the control cells are reset is determined by the flip-flop 136. Assuming the processor 150 was triggered by the proper voltages on the lines 131-131, the discharge of the capacitor 135 through resistor 170 will turn transistor 177 off and transistor 180 on. This results in the line 181 carrying a positive voltage and the line 182 being at ground. When the line 147 returns to a positive potential after process completion, the pulse is allowed to pass through diode 152 to the amplifier 151 because of the positive voltage on line 181. The input to amplifier 155 is grounded because of the ground potential on line 182. The positive voltage pulse is passed to lines 131-131 through the capacitor 162 and the diodes 165-165 to reset the control cells.

Conversely, if the processor 150 was triggered by control cells connected to lines 142-142, the capacitor 146 will discharge through resistor 170 and cause transistor 180 to turn off and transistor 177 to turn on. The resulting positive voltage on line 182 allows the positive pulse on line 147 to be amplified by amplifier 155 and passed to the lines 142-142 through capacitor 166 and diodes 167-167. The ground potential on line 181 prohibits the positive pulse on line 147 from reaching the amplifier 151. Through addition of appropriate circuit elements, simultaneous activation of both sets of inputs on lines 131-131 and 142-142 could be made to activate the process step twice in either a random or priority order.

FIG. 8 indicates how control cells, operators and processors may be connected to produce an integrated system. A plurality of control cells 185, 186 . . . , 191 are arranged with their output lines 185a, 185b, 186a, . . . , 191b extended for connection to the operators 192, 193, . . . , 195. Each operator is coupled to one of the processors 197, 198, . . . , 200, and has a plurality of lines 192a, 192b, . . . , 195d extended for connection to the control cell lines. An input terminal 206 provides a means for presetting the control cells 185, 186, . . . , 191. More specifically, the control cells are preset such that the output lines are supplied with voltage representations of a binary "1" or "0" as appropriate to cause the proper operator to activate the processor for the first step.

A primary advantage of this invention is that the configuration of FIG. 8 is generally applicable to all design problems; therefore, printed circuit boards or similar hardware may be mass produced and stocked prior to the need for specific implementation. To use such a board, once the control graph phase of a design is completed, a technician need only provide an electrical connection between the appropriate control cell and operator lines. For example, if the vector (A, B, C) = (1, 1, 0) is to be the initial starting point for a process, line 185a would be electrically coupled to line 192a at node 201, line 186a would be coupled to line 192b at node 202, and line 187b would be coupled to line 192c at node 205. By externally presetting the control cell A(185) to "1", B(186) to "1", and C(187) to "0", via the preset terminal 206, operator 192 would activate the first process step within processor 197. Any unused lines to the operator 192, for example line 192d in this case, could be permanently grounded to allow the operator 192 to function. A signal indicating completion of the first step would be sent from the processor 197 to the operator 192, which would activate the lines 192a, 192b and 192c to complement the control cells A(185), B(186) and C(187). The lines from operator 193 and the appropriate control cells would be electrically converted so that the new vector would trigger step 2 of the process, indicated at 198. The remaining operators would be connected to the control cells in a similar manner to complete the system.

FIG. 8 could be embodied as a printed circuit board with the control cell lines printed on one side and the operator lines printed on the other. Electrical connections then could be simply and efficiently made by thru-hole plating. Alternatively, the design could be configured as a monolithic integrated circuit with the correction pattern realized by one of the techniques commonly used in read-only memories.

Figure 9:
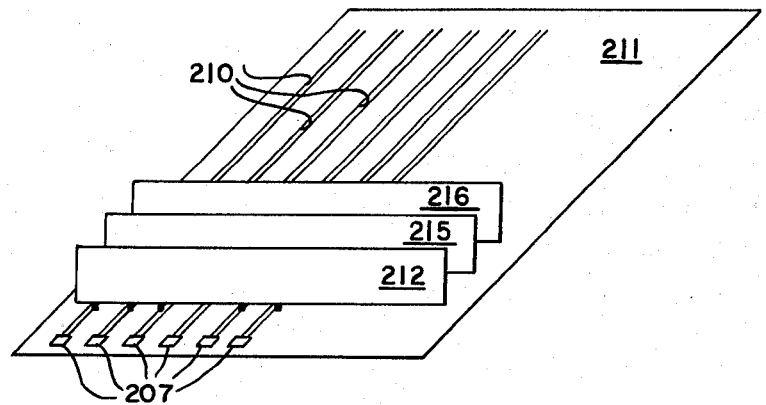
FIG. 9 illustrates one manner in which the invention may be configured.

FIG. 9 illustrates a second possible method of configuring the invention wherein the control cells 207-207 and their leads 210-210 might be constructed on a first printed circuit board 211, and the operators and their leads on plug-in type boards 212, 215, 216, with one operator per board. Appropriate connections might easily be made by a wire-wrap or similar method.

Having thus described our invention and what we conceive to be the best manner of making and using it, we express out intention that it be not restricted to the specific embodiments there set forth, and that it be limited only as claimed herein below.

We claim:

1. An apparatus for the automatic sequencing of a process comprising:

a processor capable of performing a process step upon activation, and of providing a signal upon completion of the step;

a plurality of control cells;

means for inserting a predetermined electrical signal representation of a binary value into each control cell;

an operator connecting the processor and selected ones of said control cells, the operator activating the processor upon receipt of a predetermined group of binary values from the selected control cells, and means for complementing the values in selected ones of said selected control cells upon receipt of the completion signal from the processor.

2. The apparatus of claim 1 further comprising a plurality of operators, each operator connected to said processor and having means to activate the processor upon receipt of a unique predetermined group of binary values.

3. The apparatus of claim 2 wherein said processor includes means for performing a plurality of process steps, each step sequentially performed upon activation of the processor by an operator.

4. The apparatus of claim 3 wherein each operator includes means for activating a separate process step.

5. An apparatus for the automatic sequencing of a process, comprising:

a processor capable of performing a plurality of process steps upon activation, and of providing a signal upon completion of each step;

a plurality of control cells;

means for inserting a predetermined electrical signal representation of a binary value into each control cell;

a plurality of operators, each operator connecting the processor and selected ones of said control cells and including means for activating the processor upon receipt of a unique predetermined group of binary values from the selected control cells, and means for complementing the values in selected ones of said selected control cells upon receipt of the completion signal from the processor such that each succeeding process step is initiated by the unique combination of binary values in the control cells following complementation resulting from the completion of the preceeding process step.

6. The apparatus of claim 5 wherein said operators have a plurality of control lines.

7. The apparatus of claim 5 wherein said operators include means for performing a logical operation on the values represented by the electrical signals.

8. The apparatus of claim 5 wherein the complementing means includes means for complementing the values in all of said selected control cells.

9. The apparatus of claim 5 wherein the complementing means includes means for complementing the values in less than all of said selected control cells.

10. The apparatus of claim 9 wherein the processor includes means for providing a signal adapted to control the selection of said values to be complemented.

* * * * *